United States Patent [19]

Nemeth

[11] Patent Number: 4,831,339

[45] Date of Patent: May 16, 1989

[54] OSCILLATOR HAVING LOW PHASE NOISE

[75] Inventor: Robert Nemeth, New Cumberland, Pa.

[73] Assignee: Nemeth-Bates Corp, New Cumberland, Pa.

[21] Appl. No.: 88,089

[22] Filed: Aug. 21, 1987

[51] Int. Cl.⁴ ............................................. H03L 7/00
[52] U.S. Cl. ........................................ 331/25; 331/2; 331/46
[58] Field of Search ............................ 331/2, 25, 46

[56] References Cited

U.S. PATENT DOCUMENTS

| | | | |
|---|---|---|---|
| 2,228,323 | 1/1941 | Mortley | 250/36 |
| 2,617,039 | 11/1952 | Young | 250/36 |
| 2,875,337 | 2/1959 | Robinson | 250/36 |
| 3,177,444 | 4/1965 | Foot | 331/22 |
| 3,235,815 | 2/1966 | Keicher | 331/39 |
| 3,249,888 | 5/1966 | Hoffmann | 331/38 |
| 3,339,148 | 8/1967 | Woodward | 331/3 |
| 3,372,347 | 3/1968 | Jones et al. | 331/39 |
| 3,546,588 | 12/1970 | Campbell, Jr. | 325/42 |
| 3,644,827 | 2/1972 | Landefeld | 324/79 |
| 3,711,773 | 1/1973 | Hekimian et al. | 324/83 R |
| 3,737,766 | 6/1973 | Lubarsky, Jr. | 324/57 R |
| 3,838,355 | 9/1974 | Papaieck | 331/39 |
| 3,961,255 | 6/1976 | Hekimian | 324/83 R |
| 4,095,190 | 6/1978 | Imazeki et al. | 331/2 |
| 4,303,893 | 12/1981 | Goldberg | 331/1 A |
| 4,551,689 | 11/1985 | Scala et al. | 331/2 |
| 4,580,289 | 4/1986 | Enderby | 455/314 |
| 4,634,962 | 1/1987 | Banura et al. | 324/57 N |

OTHER PUBLICATIONS

"Measure Phase Noise", Chuck Reynolds Electronic Design, vol. 4, Feb. 15, 1977.
INSPEC Abstracts.
Hewlett Parckard Product Note 11729 B-1.
Hewlett Packard Application Note 283-3.
Hewlett Packard Spectrum Analyzer System 3047 A.
"A Comparison of Phase Noise in Synthesizer Design" Bates and Nemeth, Microwave Systems News & Communication Technology, Jan. 1987.

Primary Examiner—Eugene R. Laroche
Assistant Examiner—Robert J. Pascal
Attorney, Agent, or Firm—Brumbaugh, Graves, Donohue & Raymond

[57] ABSTRACT

Phase noise in a carrier signal is reduced by use of a phase locked loop which is responsive to the carrier signal and another signal of comparable noise level but having non-correlated phase noise.

32 Claims, 2 Drawing Sheets

OSCILLATOR HAVING LOW PHASE NOISE

BACKGROUND OF THE INVENTION

The present invention relates to oscillators having low phase noise, and particularly to methods and arrangements for providing radio frequency signals having lower phase noise than heretofore available using techniques of the art.

In many radio frequency systems, including phase modulated digital communications systems, it is desired to use signal sources at transmitters and receivers which provide carrier signals with low phase noise. Conventionally phase noise is controlled to a low level by careful design of the primary reference signal source, e.g. a crystal oscillator. Such oscillators usually provide a signal at a reference frequency such as 10 MHz which is then processed in a frequency synthesizer to provide a local oscillator signal at the desired carrier frequency with frequency stability derived from the reference oscillator by techniques well known in the art.

U.S. Pat. No. 4,551,689 to Scala, et al. describes a system wherein phase noise arising in the synthesizing process is improved by providing an arrangement of crystal oscillators. This arrangement can effectively reduce the phase noise of a noisy signal, but can do so only to the level of the noise of the crystal oscillators provided. As mentioned in the Scala, et al. patent, phase noise is generally increased when a signal is multiplied to a higher frequency. The increase in phase noise resulting from multiplication is given in dB. as 20 log K where K is the frequency multiplication ratio. Likewise when the frequency of a carrier signal is reduced by a frequency divider the phase noise is reduced by the same factor.

The present inventor has discovered a method and arrangement which enables an increase in carrier frequency with a phase noise increase of less than 20 log K whereby in subsequent division the phase noise of a signal can be reduced to below its original level.

It is therefore an object of the present invention to provide a method and apparatus for reducing phase noise in a carrier signal to levels below those previously available and to provide apparatus for carrying out that method.

SUMMARY OF THE INVENTION

In accordance with the present invention there is provided a method for reducing the phase noise in a signal coherently derived from a supplied carrier signal. The method includes the steps of providing a second carrier signal which has non-correlated phase noise and has a noise level comparable to or below the noise level of the supplied carrier signal. Signals derived from the supplied carrier signal and second carrier signal are supplied to a first phase locked loop which includes an oscillator for generating the coherently derived signal. The loop is operated to lower the phase noise of the coherently derived signal to a value which is less than 20 log K above the phase noise of the supplied carrier signal where K is the ratio of the coherently derived signal frequency to the supplied carrier signal frequency.

In accordance with the invention there is provided a phase noise improvement circuit which includes a phase locked loop responsive to a first supplied signal having a selected frequency and responsive to a second supplied signal derived from a second reference oscillator. The second reference oscillator has phase noise which is not correlated with the phase noise of the first supplied oscillator and has a comparable or lower phase noise level.

In accordance with the present invention there is provided apparatus which is responsive to a supplied reference signal for providing an output signal having a selected frequency and low phase noise over a selected noise bandwidth. The apparatus includes a first phase locked loop for generating the output signal and responsive to the reference signal and another signal and having a loop bandwidth corresponding to the selected noise bandwidth. There is also provided a second phase locked loop responsive to the supplied reference signal for generating the other signal, the second phase locked loop having a relatively narrow bandwidth for generating the other signal to be coherent with the reference signal but having uncorrelated phase noise at frequencies outside the narrow bandwidth.

For a better understanding of the present invention, together with other and further objects, reference is made to the following description, taken in conjunction with the accompanying drawings, and its scope will be pointed out in the appended claims.

DESCRIPTION OF THE INVENTION

Figure 1:
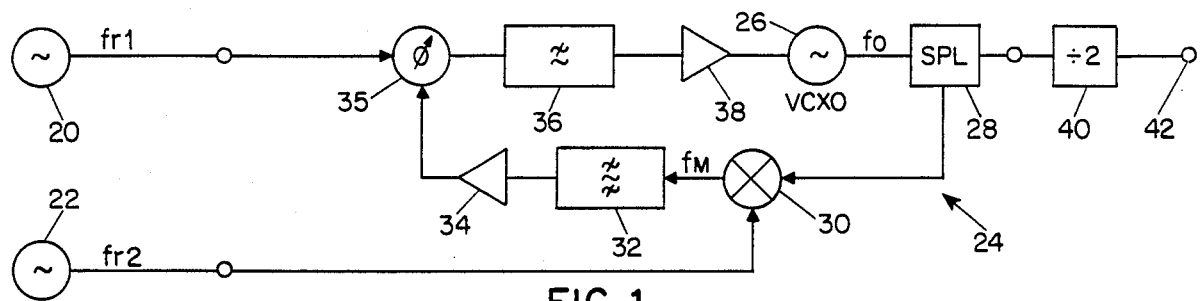
FIG. 1 is a block diagram of a circuit for reducing phase noise in accordance with the present invention.

A simplified block diagram of a phase noise improvement circuit according to the present invention is shown in FIG. 1. The circuit is supplied with a signal from reference oscillator 20 operating at a reference signal frequency of 10 MHz. There is also supplied a second reference oscillator 22 operating at the same frequency. In the example of FIG. 1, oscillators 20 and 22 are assumed to be state of the art low noise oscillators having approximately equal phase noise. Both oscillators are assumed to be independently oscillating at the same frequency so that they have non-correlated phase noise and are assumed to be of adequate and comparable frequency stability so that the circuit output maintains frequency stability. Preferably the frequency characteristic can be achieved by very narrow band phase locking of oscillator 22 to oscillator 20 without causing phase noise correlation, as will be further described.

The FIG. 1 circuit includes a phase locked loop 24 containing oscillator 26, which is preferably a voltage controlled crystal oscillator with low phase noise characteristics. Oscillator 26 is operating at a frequency of 20 MHz and has its output signal $f_o$ which is split in splitter 28 to provide a loop signal to mixer 30 which also receives the signal $f_{r2}$ from second reference oscillator 22. The output signal $f_m$ of mixer 30 has a frequency of 10 MHz, which is the difference signal between $f_o$ and $f_{r2}$. This signal is filtered in bandpass filter 32, amplified in amplifier 34 and provided to phase detector 35, which also receives signal $f_{r1}$ from oscillator 20. The detected phase variation signal is provided by filter 36 and amplifier 38 as a voltage control signal to oscillator 26.

For purposes of analyzing the phase noise of the signals in the circuit of FIG. 1 it will be assumed that the reference signals $f_{r1}$ and $f_{r2}$ from oscillators 20 and 22 each have an arbitrarily selected phase noise level of 0 dBm. Accordingly the $f_{r1}$ input signal to phase detector 35 has a phase noise level of 0 dbm. The noise contribution of reference signal $f_{r2}$ to signal $f_m$ will have a level of +3 dbm, an increase of 3 db caused by the "mixer effect" which results from the overlapping of sidebands in mixer 30.

The phase locked loop 24 will operate on oscillator 26 to clean up the noise level of output signal $f_o$ to the level of the higher phase noise of the inputs to phase detector 35, i.e., +3 dbm. Since oscillator 26 provides signal $f_o$ at a frequency of 20 MHz, which is double the $f_{r1}$ reference frequency, conventional multiplying techniques would provide a phase noise level of +6 dbm, which is 20 (log 2). Accordingly there is a 3 db improvement of the phase noise from what could be achieved by a conventional frequency doubler which follows the 20 log K rule. If $f_o$ is provided to a frequency divider 40 as shown in FIG. 1, the phase noise is reduced by 6 db and an output signal can be provided at terminal 42 with a frequency of 10 MHz, but a noise level of −3 dbm. Remarkably the output phase noise level is lower than the phase noise level of either of the input signals $f_{r1}$ or $f_{r2}$.

The inventor has discovered that such improved phase noise can only be achieved when the input reference signals $f_{r1}$ and $f_{r2}$ have non-correlated phase noise. If the phase noise of the reference signals is correlated; i.e. derived from the same oscillator or two oscillators which are locked to each other within the noise bandwidth of interest, the improvement is not realized because the signal $f_{r2}$ will have identical phase noise to signal $f_{r1}$. Oscillator 26 exhibits the same correlated jitter as $f_{r1}$ when the loop is locked. Correlated phase noise entering a double balanced mixer cancels when the difference frequency is used. Therefor only 50% of the jitter will remain at the IF output of mixer 30 due to the 2:1 ratio of the two input signals. The IF signal supplied to phase detector 35 therefore permits phase detector 35 to develop a correction signal for only 50% of the phase noise of oscillator 26. The signal $f_m$ supplied to phase detector 35 thereby permits phase detector 35 to develop a correction signal for only 50% of the phase noise in oscillator 26. Accordingly, the noise level of oscillator 26 will be corrected by loop 20 at a level 6 db higher than the noise of the reference signals $f_{r1}$ and $f_{r2}$ when the reference signals have correlated phase noise, and no net phase noise improvement is realized.

Figure 2:
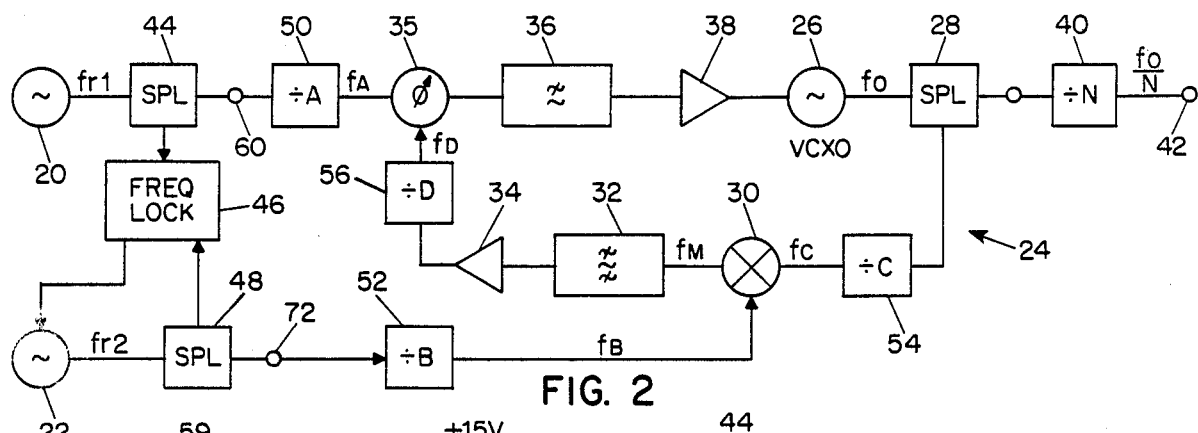
FIG. 2 is a block diagram of another circuit in accordance with the present invention for reducing phase noise.

FIG. 2 is a block diagram illustrating a more generalized phase noise improvement circuit in accordance with the present invention. In the FIG. 2 circuit the second reference oscillator 22 is frequency locked to the first reference oscillator 20 by frequency lock circuit 46. Accordingly the signal from first reference oscillator 20 is supplied to splitter 44 and a portion supplied to frequency lock circuit 46. Frequency lock circuit 46 also receives a sample of the output signal from oscillator 22 by splitter 8. Frequency lock circuit 46 is designed to have a very narrow frequency lock bandwidth, of less than 1 Hz, preferably in the order of 0.1 Hz. Accordingly, oscillator 22 is frequency locked to oscillator 20 only within the very narrow bandwidth of frequency lock circuit 46. At frequencies higher than the bandwidth of circuit 46 the phase noise of oscillator 22 is uncorrelated with the phase noise of oscillator 20. By reason of the narrow band frequency lock circuit the two signals are coherent in frequency, but have uncorrelated phase noise above the bandwidth of the frequency lock.

Figure 3:
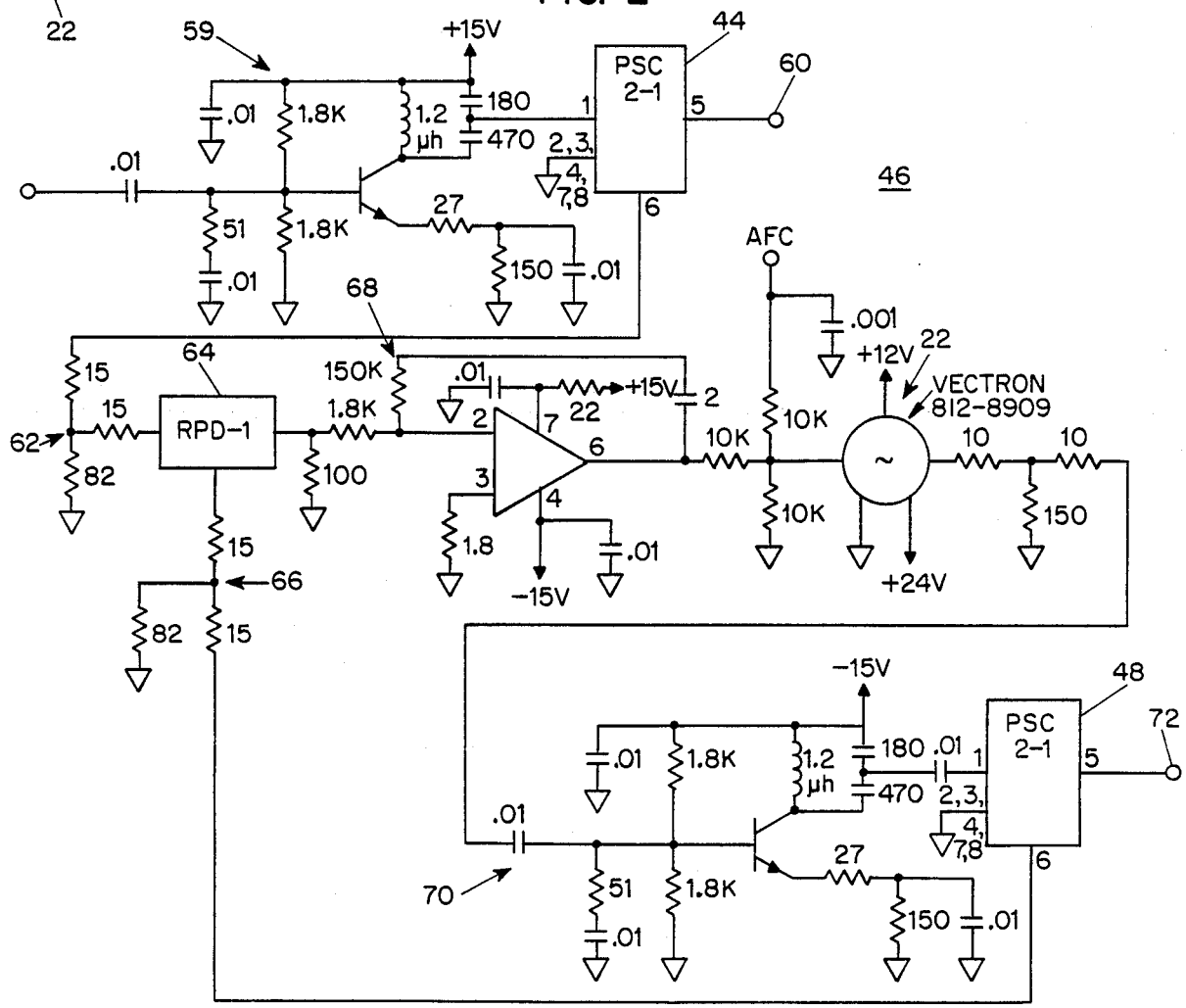
FIG. 3 is a schematic diagram of a frequency locking circuit useful in the system of FIG. 2.

Details of frequency lock circuit 46 are illustrated in FIG. 3. Amplifier 59 is connected to the output of oscillator 20 and serves as a driver for splitter 44 which provides a signal to terminal 60 for use in the main phase lock loop 24, as will be further described, and also provides a signal via by attenuator 62 to phase detector 64. Phase detector 64 is provided with a signal via attenuator 66 from splitter 48 which is driven by a driver circuit 70 which is similar to circuit 59. The output of phase detector 64 is provided to active low pass filter 68 which has a frequency cut-off of approximately 0.1 Hz. The output of filter 68 is provided as a frequency control input to oscillator 22. The output of oscillator 22 is provided by driver 70 to splitter 48. The output of splitter 48 is provided to terminal 72 which is connected to further portions of the FIG. 2 circuit.

Figure 4:
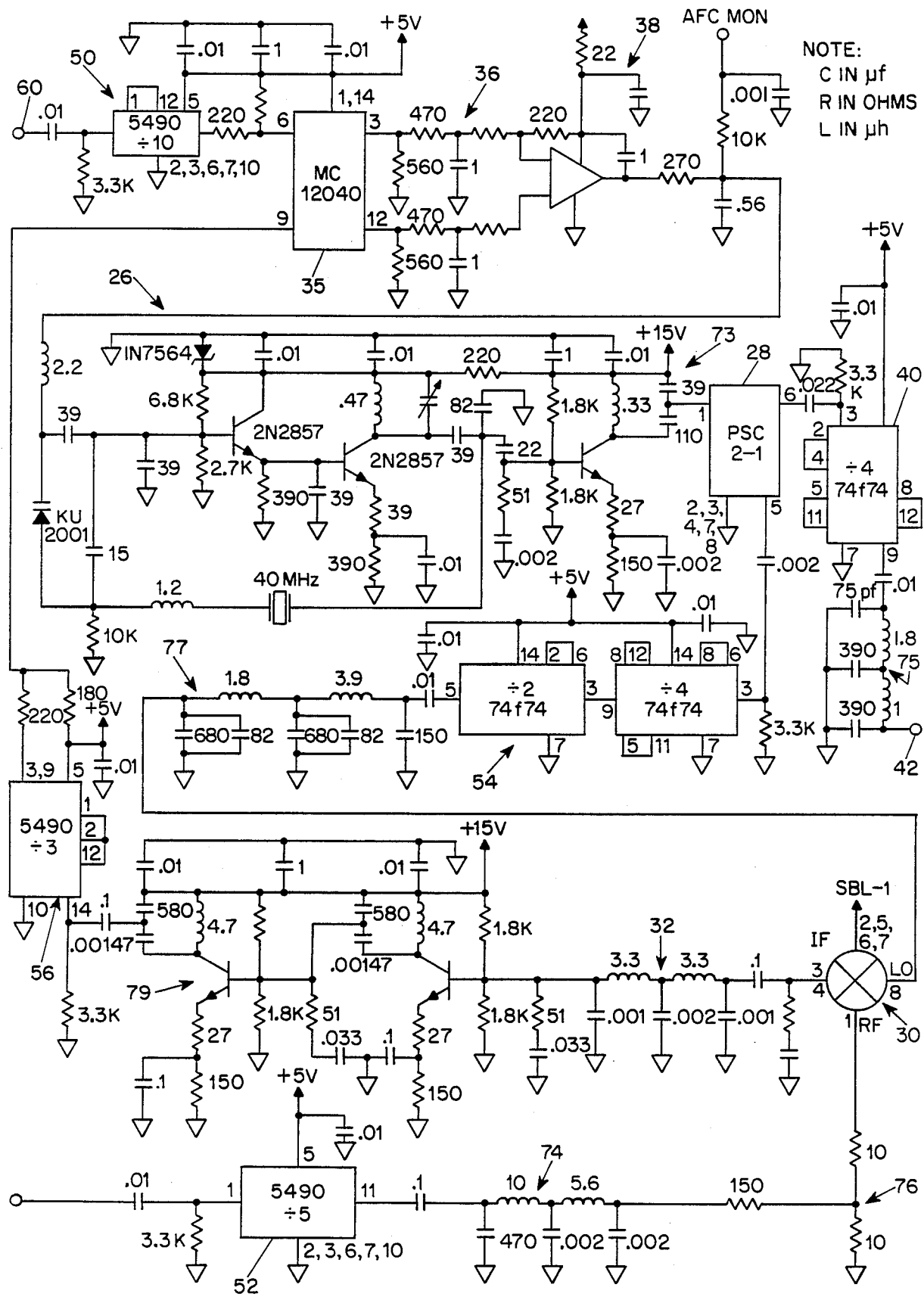
FIG. 4 is a schematic diagram of a phase locked loop useful in the system of FIG. 2.

The circuit of FIG. 2 includes frequency dividers 50, 52 54 and 56 in addition to the components which are illustrated in FIG. 1. As used herein the term frequency dividers is intended to include dividers, multipliers and combinations thereof which change the frequency of a signal by a selected ratio. The frequency dividers 50, 52, 54 and 56 are used to adjust the frequencies of the loop as will be further explained. FIG. 4 illustrates the portions of the loop of FIG. 2 which are not illustrated in FIG. 3. Included in FIG. 4 is divider circuit 50, phase detector 35 filter 36 and amplifier 38. Oscillator 26, which is a voltage controlled crystal oscillator at 40 Mhz is also illustrated in detail. The output of oscillator 26 is connected to a driver circuit 73 whose output is connected to splitter 28. The output of splitter 28 is connected to divide by four circuit 40 and output filter 75 which is a 10 Mhz low pass filter. The other output of splitter 28 is provided by divider circuit 54 and filter 77 to mixer 30 whose output is coupled to filter 32, driver circuit 79 and divider circuit 56. Filter 77 is configured as a 6 Mhz low pass filter and filter 32 is configured as a 3.7 Mhz low pass filter. The output of divider circuit 56 is connected to phase detector 35. The local oscillator input to mixer 30 is provided from terminal 72 which is connected to the output of splitter 48 in FIG. 3 by divider circuit 52 and filter 74. Filter 74 is a 2.2 Mhz low pass filter and includes attenuator 76 which is directly connected to mixer 30.

The embodiment of the circuit of FIG. 2 which is specifically illustrated in FIGS. 3 and 4 generates a signal at voltage control crystal oscillator 26 having a frequency of 40 Mhz in response to 10 Mhz signals supplied by oscillators 20 and 22. In this example, divider 50 has a division ratio of 10, divider 52 has a division ratio of 5 divider 54 has a division ratio of 8 and divider 56 has a division ratio of 3. Output divider 40, which has a division ratio of 4 may be provided to convert the output of oscillator 26 to the same frequency as the reference signal from oscillator 20, i.e. 10 Mhz, to provide an output at terminal 42 which is at the same frequency as the supplied signal, but has a lower phase noise. The lower phase noise is achieved by dividing the phase noise in divider circuit 40.

In connection with phase noise improvement circuits of the type illustrated in block diagram form in FIG. 2 the inventors have discovered that optimum phase noise is achieved for the case where oscillators 20 and 22 have the same phase noise and frequency when the division ratios are such that (B·D)/A is greater than 0.5 and preferably has a value between 1 and 2, most preferably about 1.5. This division ratio provides that the two inputs to phase detector 35 have approximately the same phase noise level so that the phase lock loop 24 may achieve the best clean up of the phase noise in the output of oscillator 26. For this division ratio the output signal has a phase noise level of approximately 4.5 dB below the phase noise level that can be achieved by multiplication.

In embodiments where oscillators 20 and 22 have different frequencies the ratio $$\frac{B \cdot D}{A} \frac{f_{r2}}{f_{r1}}$$

should be greater than 0.5, preferably between 1 and 2 and most preferably approximately 1.5. FIG. 1 illustrates an example when the ratio is 1 and the phase noise improvement compared to multiplication is 3 db. FIGS. 2 and 4 illustrate a specific example wherein the optimum ratio of 1.5 exists and the phase noise improvement is 4.5 db.

In order to achieve the optimum phase noise improvement the phase noise level of oscillator 22 should be equal to or below the noise level of oscillator 20 if the oscillators have equal frequency. It will be recognized however that some improvement can be realized if the noise level of oscillator 22 is slightly higher than that of oscillator 20, e.g. approximately 1 or 2 db higher. The noise improvement of the output signal will be degraded by the amount of such higher noise level. When oscillator 22 operates at a different frequency than oscillator 20, the noise level should be comparable, i.e. the noise level of oscillator 22 should have a 20 log K relation to the noise level of oscillator 20 where K is the ratio of the oscillator frequencies.

Those skilled in the art will recognize that various values for division ratios A, B, C and D, which determine the various frequencies of the circuit of FIG. 2 may be selected, but the optimum ratios are governed by the above described rule which makes $$\frac{B \cdot D}{A} \frac{f_{r2}}{f_{r1}}$$

approximately 1.5.

The signal $f_{r2}$ supplied to divider 52 is divided by the division ratio B to yield a signal derived from the signal from oscillator 22 which is labeled $f_B$. Likewise the output signal $f_o$ from oscillator 26, which is split in splitter 28 is provided to divider 54 wherein it is divided by a ratio C to provide a signal $f_c$. The two signals $f_B$ and $f_c$ are mixed in mixer 30 and the output signals $f_m$, preferably the lower frequency mixer output difference signal is filtered and provided to divider 56. The $f_D$ output of divider 56 is provided as a reference signal to phase detector 54 wherein signal $f_A$ is mixed therewith. Signal $f_A$ is derived from $f_{r1}$ by divider 50 which has a division ratio A. In the example illustrated in FIGS. 3 and 4, $f_{r1}$ and $F_{r2}$ are each oscillators at 10 Mhz. Divider 50 has a division ratio of 10 so that $f_A$ is 1 Mhz. Divider 52 has a division ratio of 5 so that $f_B$ is 2 Mhz. Oscillator 26 operates at 40 Mhz which is $f_o$. The output of divider 54, which has a division ratio of 8, is therefore at 5 Mhz. Signal $f_M$ is the difference between 5 Mhz of $f_A$ and 2 Mhz of $f_B$, $f_M$ therefore has a frequency of 3 Mhz. Divider 56 has a division ratio of 3 so that $f_D$ is at 1 Mhz which is the same frequency as $f_A$ at the input to phase detector 35.

Those skilled in the art will readily realize that many values for division ratios A, B, C, and D are possible with subsequent modified values for the various frequencies used in the circuit of FIG. 2. It will also be recognized that it is not necessary for operation of the circuit of FIG. 2 that oscillator 22 be at the same frequency as oscillator 20, provided that the signals are coherent but have non-correlated phase noise of comparable amplitude.

While there have been described what are believed to be the preferred embodiments of the invention, those skilled in the art will recognize that other and further modifications may be made thereto without departing from the invention and it is intended to claim all such changes and modifications as fall within the scope of the invention.

I claim:

1. A method for reducing phase noise in a signal coherently derived from a supplied carrier signal, comprising the steps of providing a second carrier signal, said second carrier signal having non-correlated phase noise with a noise level comparable to or below the noise level of said supplied carrier signal, supplying signals derived from said supplied carrier signal and said second carrier signal to a first phase locked loop, said first phase locked loop including an oscillator for generating said coherently derived signal and operating said first phase locked loop to lower the phase noise of said coherently derived signal to a value which is less than 20 log K above the phase noise of said supplied carrier signal, where K is the ratio of the frequency of said coherently derived signal to the frequency of said supplied carrier signal.

2. A method as specified in claim 1 wherein said step of providing a second carrier signal includes providing an oscillator for generating said second carrier signal and phase locking said oscillator to said supplied signal with a narrow phase lock bandwidth.

3. A method as specified in claim 2 wherein said narrow phase lock bandwidth is below 1 Hz.

4. A method as specified in claim 3 wherein said narrow phase lock bandwidth is in the order of 0.1 Hz.

5. A method as specified in claim 1 wherein said step of providing a second carrier signal comprises providing a second carrier signal with the same frequency as said supplied carrier signal.

6. A method as specified in claim 1 wherein said step of supplying signals to a first phase locked loop includes mixing signals derived from said second carrier signals with signals derived from said coherently derived signals to generate mixer signals.

7. A method as specified in claim 6 wherein said step of supplying signals to a first phase locked loop includes phase detecting said signals derived from said supplied carrier signal with signals derived from said mixer signal.

8. A method as specified in claim 7 wherein signals are derived by frequency dividing selected signals.

9. A method as specified in claim 7 wherein the ratio $$\frac{B \cdot D}{A} \frac{f_{r2}}{f_{r1}}$$

is greater than 0.5 wherein

A is the ratio of the frequency of said supplied carrier signal to the frequency of said signal derived from said supplied carrier signal;

B is the ratio of the frequency of said second carrier signal to the frequency of said signal derived from said second carrier signal;

D is the ratio of the frequency of said mixer signal to the frequency of said signal derived from said mixer signal;

$f_{r1}$ is the frequency of said supplied carrier signal; and $f_{r2}$ is the frequency of said second carrier signal.

10. A method as specified in claim 9 wherein said ratio is between 1 and 2.

11. A method as specified in claim 10 wherein said ratio is approximately 1.5

12. A phase noise improvement circuit comprising a first phase locked loop responsive to a first supplied signal derived from a first reference oscillator having a selected reference frequency and a second supplied signal derived from a second reference oscillator, said second reference oscillator having phase noise which is noncorrelated with the phase noise of said first supplied signal outside a relatively narrow bandwidth and a noise level comparable to or below the noise level of said first supplied signal, and a second phase locked loop having a narrow bandwidth for phase locking said second reference oscillator to said first supplied signal within said narrow bandwidth.

13. A circuit as specified in claim 12 wherein said narrow bandwidth is below 1 Hz.

14. A circuit as specified in claim 13 wherein said narrow bandwidth is in the order to 0.1 Hz.

15. A circuit as specified in claim 12 wherein said first phase locked loop comprises a voltage controlled oscillator for providing a phase noise improved signal, a mixer responsive to a signal derived from said phase noise improved signal and a signal derived from said second reference signal for generating a mixer signal and a phase detector responsive to said first reference signal and a signal derived from said mixer signal.

16. A circuit as specified in claim 15 further including divider means having selected dividing ratios for dividing the frequency of selected signals.

17. A circuit as specified in claim 16 wherein the dividing ratio of said divider means are selected to provide a selected value for the expression:

$$\frac{B \cdot D}{A} \cdot \frac{f_{r2}}{f_{r1}}$$

wherein

B is the second reference signal dividing ratio

D is the mixer signal dividing ratio

A is the first reference signal dividing ratio $f_{r2}$ is the second reference signal frequency and $f_{r1}$ is the first reference signal frequency.

18. A circuit as specified in claim 17 wherein said selected value is greater than 0.5.

19. A circuit as specified in claim 17 wherein said selected value is between 1 and 2.

20. A circuit as specified in claim 17 wherein said selected value is approximately 1.5.

21. Apparatus responsive to a supplied reference signal for providing an output signal having a selected frequency and low phase noise over a selected noise bandwidth, comprising:

a first phase locked loop for generating said output signal and responsive to said reference signal and another signal and having a loop bandwidth corresponding to said selected noise bandwidth;

and a second phase locked loop responsive to said supplied reference signal for generating said other signal, said second phase locked loop have a relatively narrow bandwidth for generating said other signal to be coherent with said reference signal but having uncorrelated phase noise at frequencies outside the narrow bandwidth.

22. Apparatus as specified in claim 21 wherein said second phase locked loop has a bandwidth of less than 1 Hz.

23. Apparatus as specified in claim 22 wherein said second phase locked loop has a bandwidth in the order of 0.1 Hz.

24. Apparatus as specified in claim 23 wherein said second phase locked loop includes a voltage controlled crystal oscillator having low phase noise.

25. Apparatus as specified in claim 23 wherein there is further provided a mixer in said first phase locked loop connected to receive a signal derived from said output signal and a signal derived from said other signal.

26. Apparatus as specified in claim 25 wherein said first phase locked loop includes a first frequency divider for responsive to said output signal for deriving said signal therefrom.

27. Apparatus as specified in claim 25 wherein there is provided a second frequency divider responsive to said other signal for deriving said signal therefrom.

28. Apparatus as specified in claim 25, 26 or 27 wherein there is provided a third frequency divider responsive to said output of said mixer for developing a phase reference signal.

29. Apparatus as specified in claim 28 wherein there is provided a fourth divider responsive to said reference signal for developing an input signal having a frequency equal to the frequency of said phase reference signal, and wherein said phase locked loop includes a phase detector responsive to said input signal and said phase reference signal.

30. Apparatus as specified in claim 29 wherein the product of the divider ratios for said second and third dividers and the frequency of said by the ratio of said fourth divider and the frequency of said reference signal is greater than 0.5.

31. Apparatus as specified in claim 30 wherein said product of the divider ratios for said second and third dividers and the frequency of said other signal divided by the ratio of said fourth divider and the frequency of said reference signal is between 1 and 2.

32. Apparatus as specified in claim 31 wherein said product of the divider ratios for said second and third dividers and the frequency of said other signal divided by the ratio of said fourth divider and the frequency of said reference signal is approximately 1.5.

* * * * *

UNITED STATES PATENT AND TRADEMARK OFFICE
CERTIFICATE OF CORRECTION

PATENT NO. : 4,831,339

DATED : May 16, 1989

INVENTOR(S) : Robert Nemeth

It is certified that error appears in the above-identified patent and that said Letters Patent is hereby corrected as shown below:

Col. 3, line 63, "8" should read --48--.
Col. 4, line 12, "via by" should read --via--.
       line 68, "inventors have" should read --inventor has--.
Col. 7, line 35, "to 0.1" should read -- of 0.1--.
Col. 8, line 13, "have" should read --having--;
       line 33, delete "for" (first occurrence);
       line 51, after "said" (first occurrence) insert --other signal divided--.

Signed and Sealed this

Twenty-first Day of August, 1990

Attest:

HARRY F. MANBECK, JR.

*Attesting Officer*   *Commissioner of Patents and Trademarks*